United States Patent [19]
Watanabe et al.

[11] Patent Number: 5,313,110
[45] Date of Patent: May 17, 1994

[54] MONOSTABLE MULTIVIBRATING CIRCUIT

[75] Inventors: Yoshio Watanabe; Tatsuaki Kitta, both of Kawasaki, Japan

[73] Assignee: Fujitsu Limited, Kawasaki, Japan

[21] Appl. No.: 118,686

[22] Filed: Sep. 10, 1993

Related U.S. Application Data

[63] Continuation of Ser. No. 854,838, Mar. 20, 1992, abandoned.

[30] Foreign Application Priority Data

Mar. 20, 1991 [JP] Japan .................................. 3-057472

[51] Int. Cl.⁵ ............................................. H03K 3/284
[52] U.S. Cl. .................... 307/273; 307/254; 307/265; 307/360; 307/263; 328/185
[58] Field of Search ............... 307/228, 254, 265, 266, 307/267, 268, 273, 355, 358, 360, 593, 603, 263; 328/55, 58, 207, 185

[56] References Cited

U.S. PATENT DOCUMENTS

| | | | |
|---|---|---|---|
| 3,820,029 | 6/1974 | McKinley | 328/58 |
| 3,952,213 | 4/1976 | Fukaya | 307/265 |
| 4,293,781 | 10/1981 | Yamada et al. | 307/273 |
| 4,297,601 | 10/1981 | Wada et al. | 307/555 |
| 4,574,202 | 3/1986 | Ogawa | 307/261 |
| 4,667,118 | 3/1987 | Maruta | 328/207 |
| 4,691,120 | 9/1987 | Kondo | 307/265 |
| 4,992,681 | 2/1991 | Urakawa et al. | 307/264 |
| 4,999,527 | 3/1991 | Gontowski | 307/273 |

FOREIGN PATENT DOCUMENTS

0134912 5/1990 Japan .
2-134912 5/1990 Japan .

OTHER PUBLICATIONS

Patent Abstracts of Japan, vol. 14, No. 371 (E-963)(4314) Aug. 10, 1990 & JP-A-21 34 912 (Sanyo Electric Co. Ltd.) May 23, 1990 abstract.

Primary Examiner—Timothy P. Callahan
Assistant Examiner—Terry D. Cunningham
Attorney, Agent, or Firm—Staas & Halsey

[57] ABSTRACT

A monostable multivibrating circuit includes: a time constant setting circuit responsive to an input pulse signal, for outputting at least one signal having a time constant different from that of the input pulse signal; and an emitter-coupled logic circuit including a first pair of transistors, one base receiving the input pulse signal and another base receiving a first reference signal, and a second pair of transistors, one base receiving an output signal of the time constant setting circuit and another base receiving a second reference signal. The monostable multivibrating circuit outputs a one-shot pulse defined by a pulse starting time corresponding to a change in level of the one base input of the first pair of transistors and a pulse stopping time corresponding to a change in level of the one base input of the second pair of transistors. The one-shot pulse presents "H" level only when the base input of the first pair of transistors is at "L" level and the one base input of the second pair of transistors is at "H" level. By this constitution, it is possible to determine the number of stages of circuits regardless of the duration of the one-shot pulse and thus facilitate a standardization of the circuit designing. Also, it is possible to reduce an occupation area thereof and decrease a power dissipation thereby.

26 Claims, 11 Drawing Sheets

MONOSTABLE MULTIVIBRATING CIRCUIT

This application is a continuation of application Ser. No. 07/854,838, filed Mar. 20, 1992, now abandoned.

BACKGROUND OF THE INVENTION

1. Field of the Invention

The present invention relates to a monostable multivibrating circuit which is also referred to as a one-shot pulse generating circuit. More particularly, it relates to a monostable multivibrating circuit in which the number of circuit elements can be determined regardless of a length of duration of the one-shot pulse.

One-shot pulses are generally pulses each having a relatively short duration and employed in various uses, for example, as a reset signal or a timing signal in semiconductor memory devices. To this end, a one-shot pulse generating circuit (i.e., monostable multivibrating circuit) is incorporated into various semiconductor devices and thus widely utilized.

2. Description of the Related Art

In a known example of the monostable multivibrating circuit, a plurality of gate circuits each having a predetermined operation delay time are employed in combination to generate a one-shot pulse. In this case, the duration of the one-shot pulse is determined by the respective operation delay times in each gate circuit or the differences therebetween. In other words, the number of gate circuits to be required is determined in accordance with the duration of the one-shot pulse. This results in a problem in that, where a one-shot pulse having a relatively long duration is generated, the number of stages of gate circuits to be used is accordingly increased.

Also, due to the increase in the number of the gate circuits, a problem occurs in that an occupation area of the circuits in a semiconductor device is relatively increased and a power dissipation thereby also becomes increased. Furthermore, where a plurality of one-shot pulses each having a duration different from each other are generated, the corresponding plurality of monostable multivibrating circuits must be prepared. In this case, the respective circuit constitutions are different from each other. As a result, a drawback occurs in that it is difficult to standardize a circuit designing of a semiconductor device provided with one-shot pulse generating circuits Another example of the monostable multivibrating circuit is known in Japanese unexamined Patent Publication No. 2-134912. The circuit constitution includes an exclusive-OR circuit constituted in the form of an emitter-coupled logic (ECL), which includes two pairs of transistors each pair having emitters commonly connected to each other and receiving an identical input signal and an identical reference voltage, and one pair of transistors each having an emitter commonly connected to each other and receiving another input signal and another reference voltage. According to the circuit constitution, a one-shot pulse is output when the two input signals are at an inverse logic level to each other. There is posed, however, a problem in that the constitution of the ECL circuit relatively becomes complicated.

Note, the problems in the prior art will be explained later in detail in contrast with the preferred embodiments of the present invention.

SUMMARY OF THE INVENTION

An object of the present invention is to provide a monostable multivibrating circuit in which the number of stages of circuits to be used can be determined regardless of a duration of a one-shot pulse to be required, and by which a standardization of a circuit designing can be facilitated.

Another object of the present invention is to provide a monostable multivibrating circuit which can relatively reduce an occupation area thereof and decrease a power dissipation thereby.

According to the present invention, there is provided a monostable multivibrating circuit including: a fall time setting circuit responsive to an input pulse signal, for outputting at least one signal having a fall time different from that of the input pulse signal; and an emitter-coupled logic (ECL) circuit including a first pair of transistors each having an emitter commonly connected to each other, one base receiving the input pulse signal or an output signal of the fall time setting circuit and another base receiving a first reference signal, and a second pair of transistors each having an emitter commonly connected to each other, one base receiving another output signal of the fall time setting circuit and another base receiving a second reference signal. In the constitution, a one-shot pulse defined by a pulse starting time corresponding to a change in level of the one base input of the first pair of transistors and a pulse stopping time corresponding to a change in level of the one base input of the second pair of transistors is output, and the one-shot pulse presents "H" level only when the one base input of the first pair of transistors is at "L" level and the one base input of the second pair of transistors is at "H" level.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements and thus the repetition of explanation thereof is omitted.

First, for a better understanding of the preferred embodiments of the present invention, the related prior art will be explained with reference to FIGS. 1 and 2A to 2C.

Figure 1:
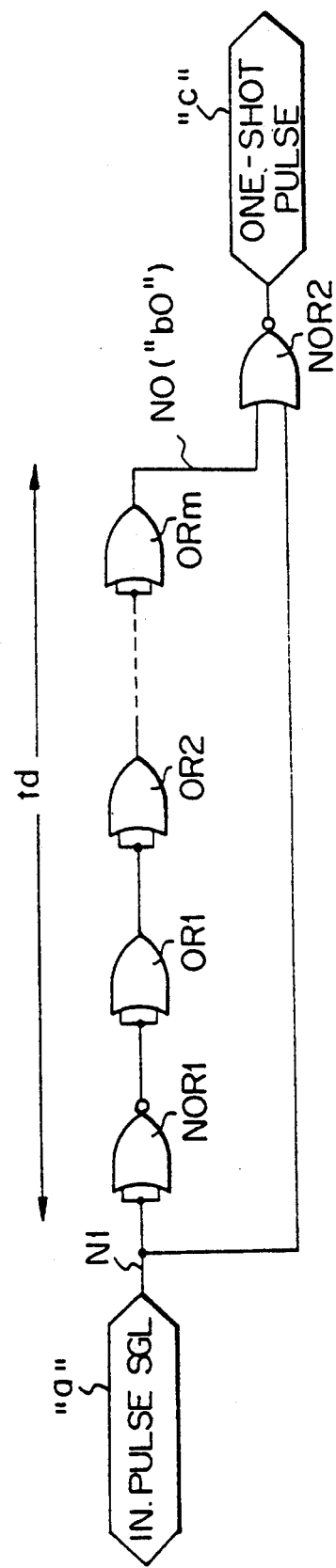
FIG. 1 is a circuit diagram showing a constitution of a prior art monostable multivibrating circuit.

FIG. 1 illustrates a constitution of a prior art monostable multivibrating circuit.

The illustrated circuit is constituted by a first logically Not-OR gate (NOR gate) NOR1 responsive to an external input pulse signal "a" fed via an input node N1, m series-connected OR gates OR1,OR2, ... ...,ORm responsive to an output signal of the NOR gate NOR1, and a second NOR gate NOR2 responsive to a signal "b0" at an output node N0 of the OR gate ORm and the input pulse signal "a" and outputting a one-shot pulse "c".

Figures 2A, 2B, 2C:
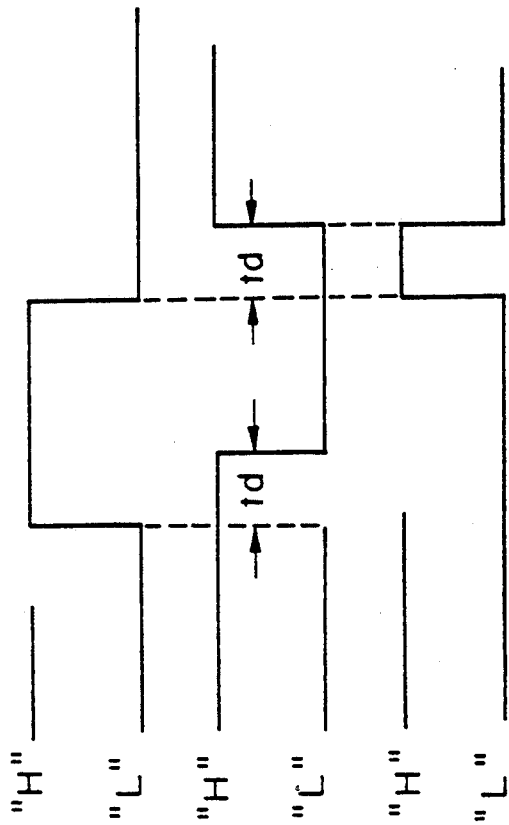
FIGS. 2A to 2C are timing charts for explaining the operation of the circuit shown in FIG. 1.

The operation of the prior art circuit will be explained with reference to FIGS. 2A to 2C, which show signal waveforms at each node in the circuit.

When the input pulse signal "a" is received at the input node N1, the first NOR gate NOR1 and the OR gates OR1~ORm in combination invert the input pulse signal "a" and delay the inverted signal by a predetermined time "td" to thereby produce the signal "b0" at the node N0. The second NOR gate NOR2 responds to the delayed and inverted signal "b0" and the input pulse signal "a" and thereby outputs the one-shot pulse "c" having a duration of "td". In this case, since the duration "td" is determined by the number of stages (m) of the series-connected OR gates, the number of the OR gates OR1~ORm to be used must be determined in accordance with the duration "td" of the One-shot pulse to be required.

According to the constitution of the above prior art monostable multivibrating circuit, the one-shot pulse is generated by means of the respective operation delay times in each gate or the differences therebetween Accordingly, the number of stages of the OR gates to be used must be determined in accordance with the duration "td" of the one-shot pulse to be generated. This results in a problem in that, where a one-shot pulse having a relatively long duration of, e.g., five or six (ns), is generated, the number of stages of the OR gates is increased. Also, due to the increase in the number of the gates, a problem occurs in that the area occupied by the gates in a semiconductor device is relatively increased and thus the power dissipated thereby also becomes increased.

Figure 3A:
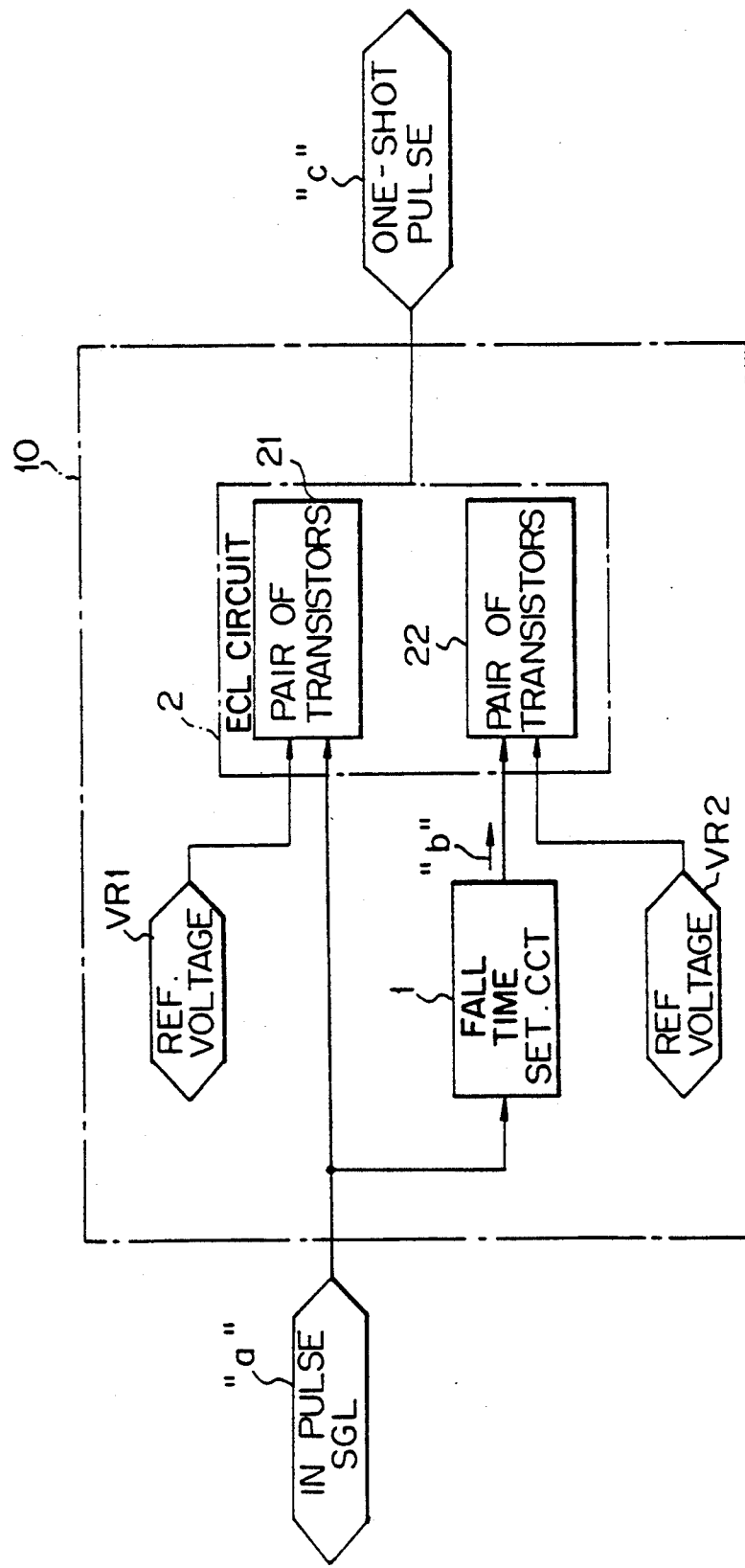
FIGS. 3A and 3B are block diagrams showing a fundamental constitution of the monostable multivibrating circuit according to the present invention.
Figure 3B:
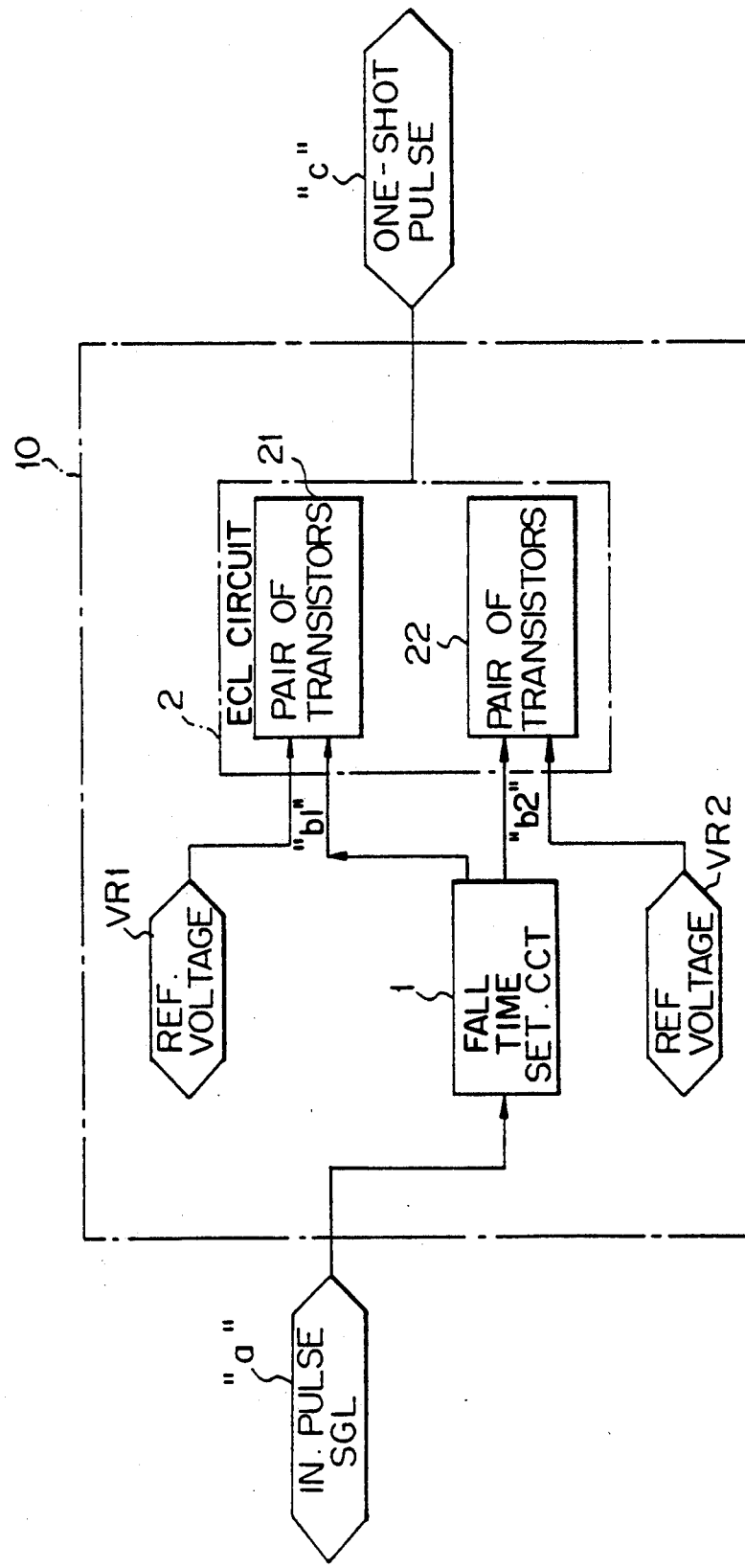

Also, where a plurality of one-shot pulses each having a duration different from each other are generated, the corresponding plurality of one-shot pulse generating circuits must be prepared. In this case, since the number of gates to be used is individually determined in accordance with the respective desired durations of one-shot pulse, the respective circuit constitutions are different from each other. As a result, another problem occurs in that it is difficult to standardize a circuit designing of a semiconductor device provided with one-shot pulse generating circuits FIG. 3 illustrates a fundamental constitution of the monostable multivibrating circuit (10) according to the present invention.

In the illustration, reference 1 denotes a fall time setting circuit, which responds to an input pulse signal "a" and outputs at least one signal "b" having a fall time different from that of the input pulse signal "a".

Reference 2 denotes an ECL circuit, which includes a first pair of transistors 21 each having an emitter commonly connected to each other, and a second pair of transistors 22 each having an emitter commonly connected to each other. One base of the first pair of transistors 21 receives the input pulse signal "a" or an output signal of the fall time setting circuit 1 as indicated by a broken line, and another base thereof receives a first reference voltage VR1. Note, the output signal indicated by a broken line corresponds to a signal "b1" shown in FIG. 7. On the other hand, one base of the second pair of transistors 22 receives another output signal "b" of the fall time setting circuit 1 and another base thereof receives a second reference voltage VR2. Note, the another output signal may be a signal "b2" shown in FIG. 7.

In the constitution, the monostable multivibrating circuit 10 of the present invention outputs a one-shot pulse "c" which is defined by a pulse starting time corresponding to a change in level of the one base input of the first pair of transistors 21 and a pulse stopping time corresponding to a change in level of the one base input of the second pair of transistors 22. As described later in detail with reference to the preferred embodiments of the present invention, the one-shot pulse "c" presents "H" level only when the one base input of the first pair of transistors 21 is at "L" level and the one base input of the second pair of transistors 22 is at "H" level.

According to the above constitution, the entire circuit 10 has a constitution equivalent to that of a gate circuit of three stages and thus the constitution is relatively simple. Accordingly, it is possible to relatively reduce an area occupied by the circuit 10 in a semiconductor device and thus decrease a power dissipation thereby. Also, the duration of the one-shot pulse "c" to be generated is determined by the detection timings of the changes in level of the respective input signals in the ECL circuit 2. As a result, it is possible to determine the circuit constitution regardless of the duration of the one-shot pulse "c" and thus facilitate a standardization of the circuit designing.

Next, the preferred embodiments of the present invention will be explained with reference to FIGS. 4 to 10. Note, in the description below, the term "transistor" indicates an NPN bipolar transistor so long as a specific definition is not added thereto.

Figure 4:
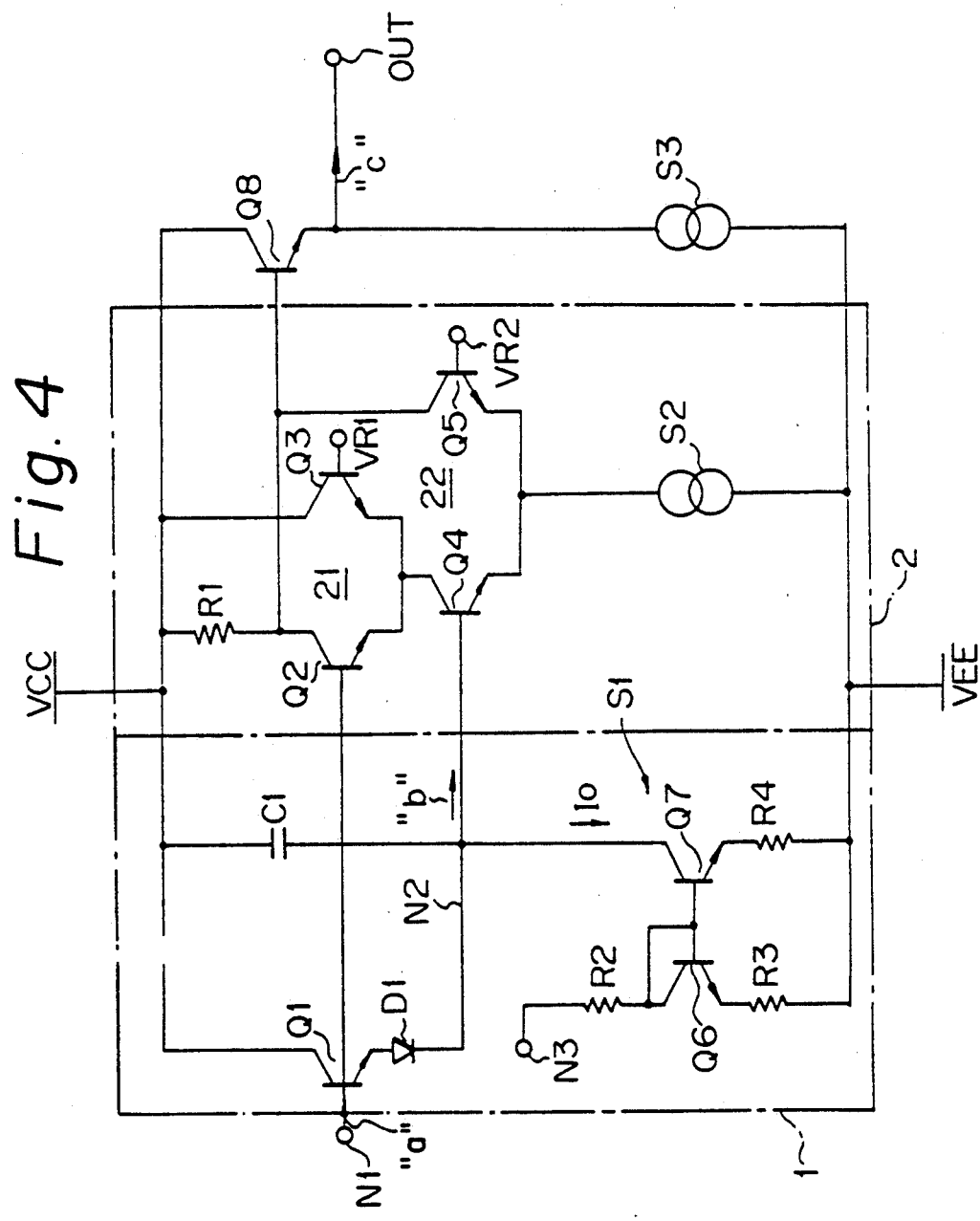
FIG. 4 is a block diagram showing a constitution of the monostable multivibrating circuit according to a first embodiment of the present invention as shown in FIG. 3A.

FIG. 4 illustrates a constitution of the monostable multivibrating circuit according to a first embodiment of the present invention.

In the illustration, reference VCC denotes a power supply line having a higher voltage and reference VEE denotes a power supply line having a lower voltage. Also reference Q1 denotes an input transistor having a collector connected to the power supply line VCC and responsive to an input pulse signal "a" fed via an input node N1, and reference D1 denotes a level shift diode connected in the forward direction between an emitter of the transistor Q1 and a node N2. The input transistor Q1 and the level shift diode D1 constitute an input stage circuit of the monostable multivibrating circuit.

The time constant setting circuit 1 includes a capacitor C1 connected between the power supply line VCC and the node N2, and a constant current source S1 connected between the node N2 and the power supply line VEE. The constant current source S1 is provided with a current setting terminal (node N3) to which a control signal for variably setting the supply current Io is applied.

The ECL circuit 2 includes: a first pair of transistors 21 each having an emitter commonly connected to each other, one transistor Q2 having a base connected to the input node N1 and another transistor Q3 having a base responsive to a first reference voltage VR1; a second pair of transistors 22 each having an emitter commonly connected to each other, one transistor Q4 having a base connected to the node N2 and a collector connected to each emitter of the transistors Q2,Q3, and another transistor Q5 having a base responsive to a second reference voltage VR2; a load resistor Ri connected between the power supply line vCC and each collector of the transistors Q2 and Q5: and a constant current source S2 connected between each emitter of the transistors Q4,Q5 and the power supply line VEE. In the present example, the first pair of transistors 21 and the second pair of transistors 22 are connected in the form of a "series" gate circuit.

Also, reference Q8 denotes an output transistor having a collector connected to the power supply line vCC and an emitter connected to an output node OUT, and reference S3 denotes a constant current source connected between the output node OUT and the power supply line VEE. The output transistor Q8 responds to a current signal fed via the load resistor R1 from the power supply line VCC and thereby outputs a one-shot pulse "c" as the emitter output to the output node OUT. The output transistor Q8 and the constant current source S3 can be removed, for example, where the load of a subsequent stage to be driven is light or small.

Figure 5:
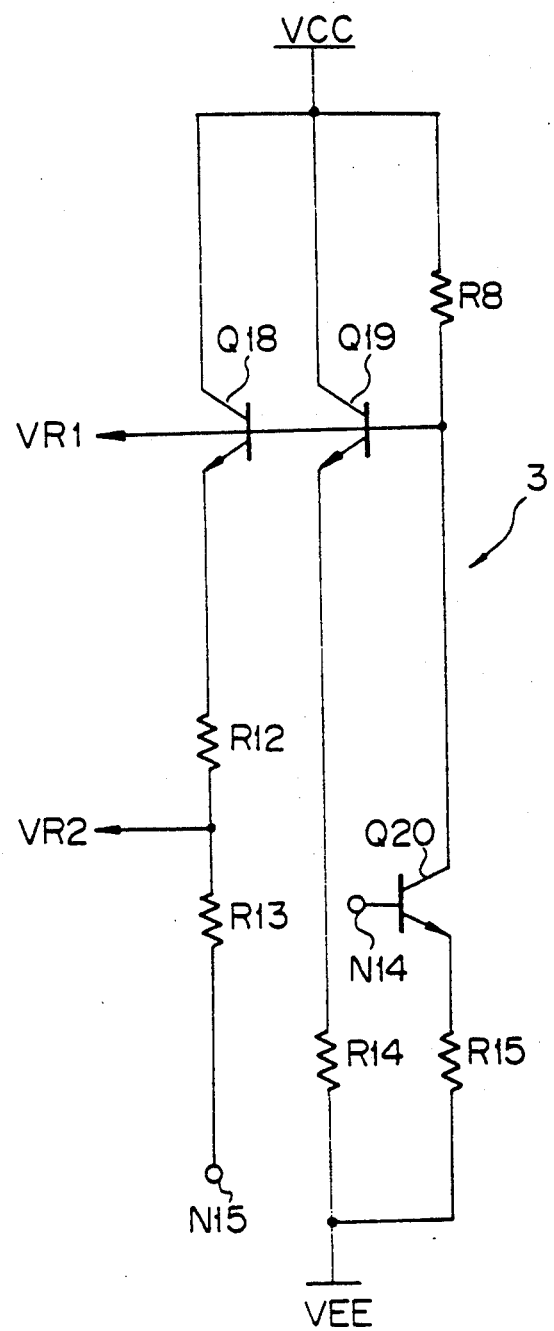
FIG. 5 is a circuit diagram showing a constitution of the reference voltage generating circuit applied to each embodiment of the present invention.
Figure 6:
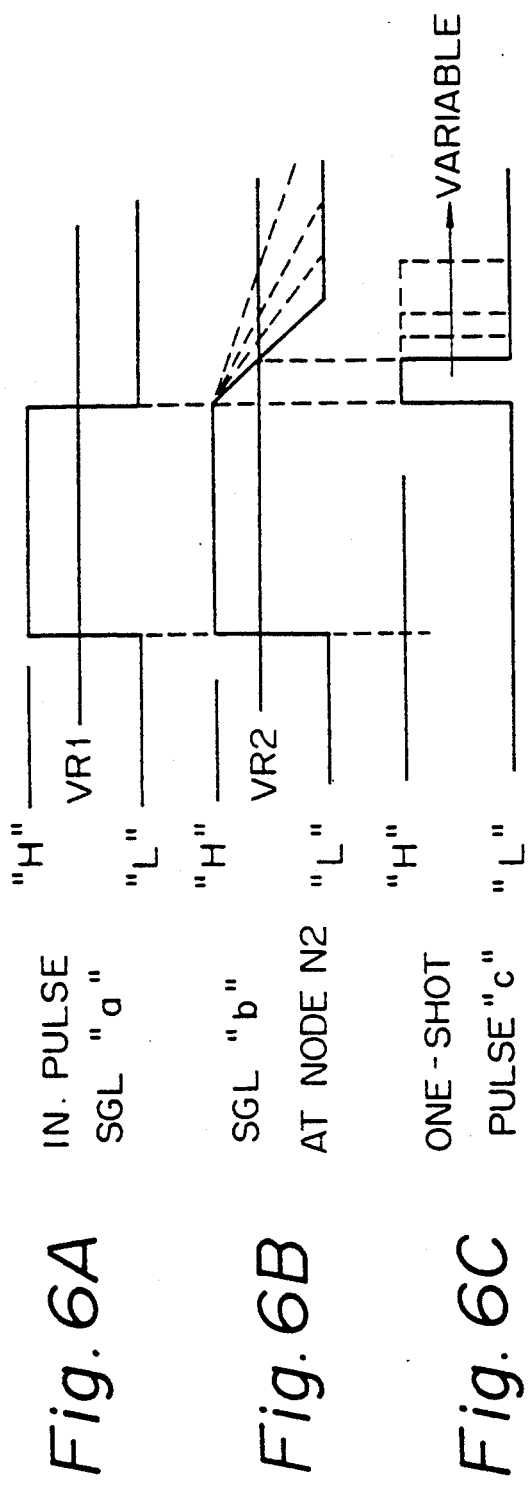
FIGS. 6A to 6C are timing charts for explaining the operation of the circuit shown in FIG. 4.

FIG. 5 illustrates a constitution of the reference voltage generating circuit 3 for supplying the ECL circuit 2 with the reference voltages VR1 and VR2.

The illustrated circuit 3 includes: a resistor R8 connected to the power supply line VCC; a transistor Q20 having a collector connected to the resistor R8 and responsive to a voltage signal fed from a control terminal (node N14); a resistor R15 connected between an emitter of the transistor Q20 and the power supply line VEE; a transistor Q19 having a collector connected to the power supply line VCC and a base connected to the resistor R8; a resistor R14 connected between an emitter of the transistor Q19 and the power supply line VEE; a transistor Q18 having a collector connected to the power supply line VCC and a base connected to the resistor R8; and resistors R12 and R13 connected in series between an emitter Of the transistor Q18 and a control terminal (node N15).

The first reference voltage VR1 (i.e., circuit threshold voltage of the first pair of transistors 21) is taken out from the connection point between the resistor R8 and the transistor Q20 and the second reference voltage VR2 (i.e., circuit threshold voltage of the second pair of transistors 22) is taken out from the connection point between the resistors R12 and R13.

In the constitution, the transistor Q20 and the resistor R15 constitute a constant current source, in which the supply current is determined according to the magnitude of the voltage signal applied to the node N14 Thus, the voltage drop in the resistor R8 is controlled to be constant and thereby the first reference voltage VR1 is stably kept constant. Also, since the base potential (VR1) of the transistor Q18 is constant, the transistor Q18 and the resistors R12, R13 constitute a constant current source, in which the supply current is determined according to the magnitude of a voltage signal applied to the node N15. Accordingly, the respective voltage drops in the resistors R12 and R13 are controlled to be constant and thereby the second reference voltage VR2 is stably kept constant.

The operation of the circuit according to the first embodiment will be explained with reference to FIGS. 6A to 6C, which show signal waveforms at each node in the circuit.

When the input pulse signal "a" (see FIG. 6A) is received at the input node N1, a signal "b" (see FIG. 6B) at the node N2 is raised to "H" level substantially simultaneously the pulse starting time of the input pulse signal "a" and gradually lowered toward "L" level after the pulse stopping time of the input pulse signal "a". The form of the lowering in level of the signal "b" is changed, as indicated by broken lines, according to the time constant which is variably set by the control signal applied to the node N3 of the constant current source S1.

The output of the ECL circuit 2 is given as a logical product (AND) of an inverted signal of the input pulse signal "a" and the signal "b" at the node N2. Namely, the output of the ECL circuit 2 is raised to "H" level at the timing when the input pulse signal "a" falls below the circuit threshold voltage (VR1) of the first pair of transistors 21, and is lowered to "L" level at the timing when the output signal "b" of the time constant setting circuit 1 falls below the circuit threshold voltage (VR2) of the second pair of transistors 22. The output transistor Q8 responds to the output of the ECL circuit 2 and thus outputs the one-hot pulse "c" (see FIG. 6C).

According to the present embodiment, the duration of the one-shot pulse "c" is determined by the product of a capacitance of the capacitor C1 and the current value Io of the constant current source S1 and thus it is variably set by the control signal applied to the node N3. The setting may be fixedly carried out for individual semiconductor devices, or may be variably carried out by suitably changing the control signal. Also, the duration of the one-shot pulse "c" may be changed by variably setting the circuit threshold voltage (VR2) of the second pair of transistors 22.

Figure 7:
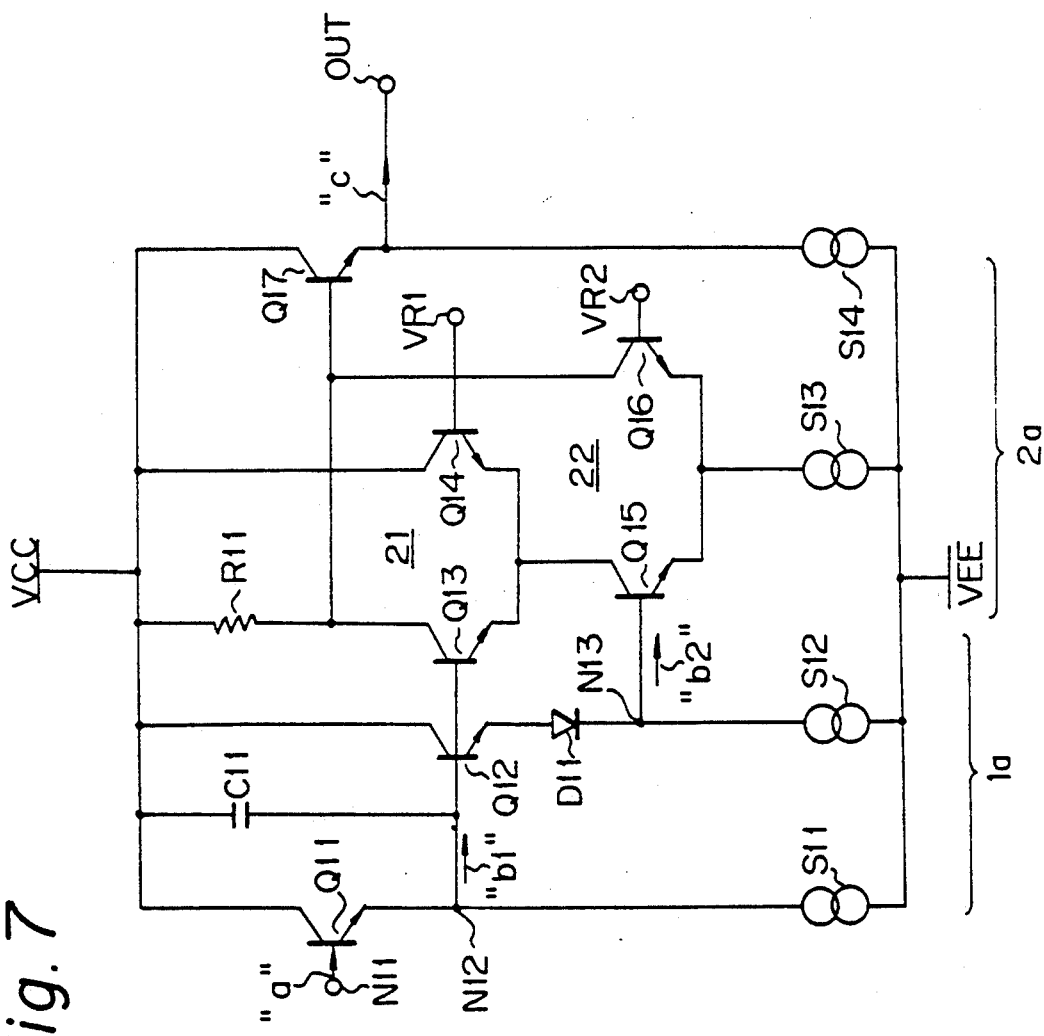
FIG. 7 is a block diagram showing a constitution of the monostable multivibrating circuit according to a second embodiment of the present invention as shown in FIG. 3B.
Figure 8:
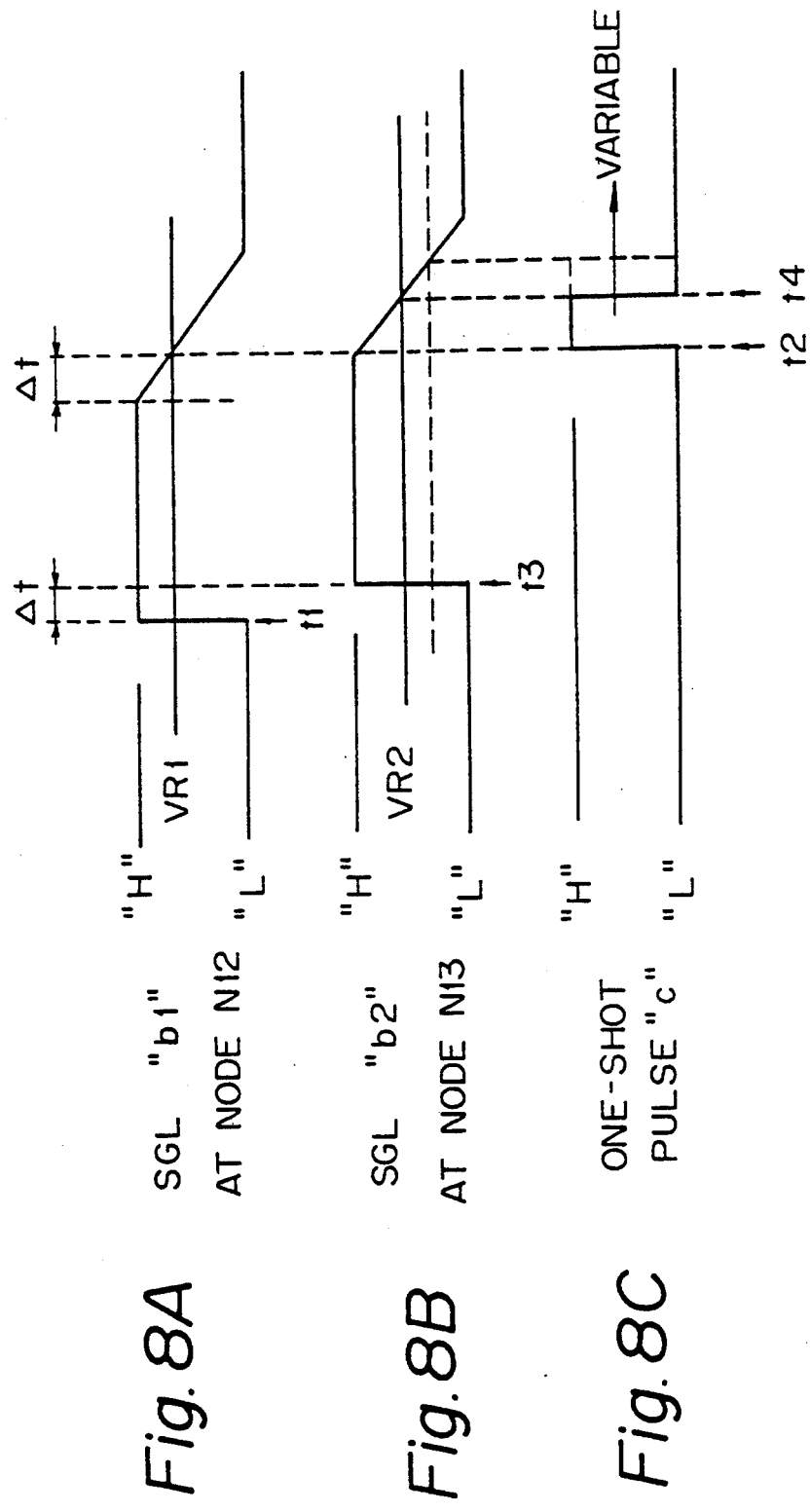
FIGS. 8A to 8C are timing charts for explaining the operation of the circuit shown in FIG. 7.

FIG. 7 illustrates a constitution of the monostable multivibrating circuit according to a second embodiment of the present invention.

In the illustration, reference 1a denotes a fall time setting circuit and reference 2a denotes an ECL circuit. The fall time setting circuit 1a includes: an input transistor Q11 having a collector connected to the power supply line VCC and responsive to the input pulse signal "a" fed via an input node N11; a constant current source S11 connected between an emitter of the transistor Q11 (node N12) and the power supply line VEE; a capacitor C11 connected between the power supply line VCC and the node N12; a transistor Q12 having a collector connected to the power supply line VCC and a base connected to the node N12; a level shift diode D11 connected in the forward direction between an emitter of the transistor Q12 and a node N13; and a constant current source S12 connected between the node N13 and the power supply line VEE. In this constitution, when the input transistor Q11 is turned ON, the ON current thereof is kept constant by the constant current source S11.

Other circuit constitution including the ECL circuit 2a and the operation thereof are the same as those in FIG. 4 and thus the explanation thereof is omitted.

Note, in the second embodiment, one transistor Q13 of the first pair of transistors 21 responds to a signal "b1" the output node N12 of the fall time setting circuit 1a, and one transistor Q15 of the second pair of transistors 22 responds to a signal "b2" at the node N13, which is formed by level-shifting the signal "b1" at the node N12.

The operation of the circuit according to the second embodiment will be explained with reference to FIGS. 8A to 8C, which show signal waveforms at each node in the circuit.

When the input pulse signal "a" is received at the input node N1, the signal "b1" (see FIG. 8A) at the node N12 is changed in level in the same manner as the signal "b" shown in FIG. 6B. Note, in this case, the form of the lowering in level of the signal "b1" is fixedly determined according to the fall time defined by a capacitance of the capacitor C11 and the supply current of the constant current source S11.

The first pair of transistors (21) detect the lowering in level of the signal "b1" at time t2 when the signal "b1" falls below the circuit threshold voltage VR1 (see FIG. 8A), and the second pair of transistors (22) detect the lowering in level of the signal "b2" at time t4 when the signal "b2" falls below the circuit threshold voltage VR2 (see FIG. 8B). As a result, the output one-shot pulse "c" has a duration defined by the pulse starting time t2 and the pulse stopping time t4 (see FIG. 8C).

The level shift circuit (transistor Q12, diode D11) produces a slight propagation time difference Δt between the signal "b1" to be input to the first pair of transistors 21 and the signal "b2" to be input to the second pair of transistors 22. Accordingly, it is possible to prevent the rise of the signal "b2" from being detected by the second pair of transistors 22 prior to the time t1 at which the signal "b1" rises to "H" level. Thus, a peak pulse which may cause an erroneous signal never appears in the output one-shot pulse "c".

Although, in the above second embodiment, the second reference voltage VR2 is variably set as indicated by a broken line in FIG. 8B, it is not restrictive. For example, only the first reference voltage VR1 may be variably set. The important point is that a potential difference between the first and second reference voltages is variably selected.

Figure 9:
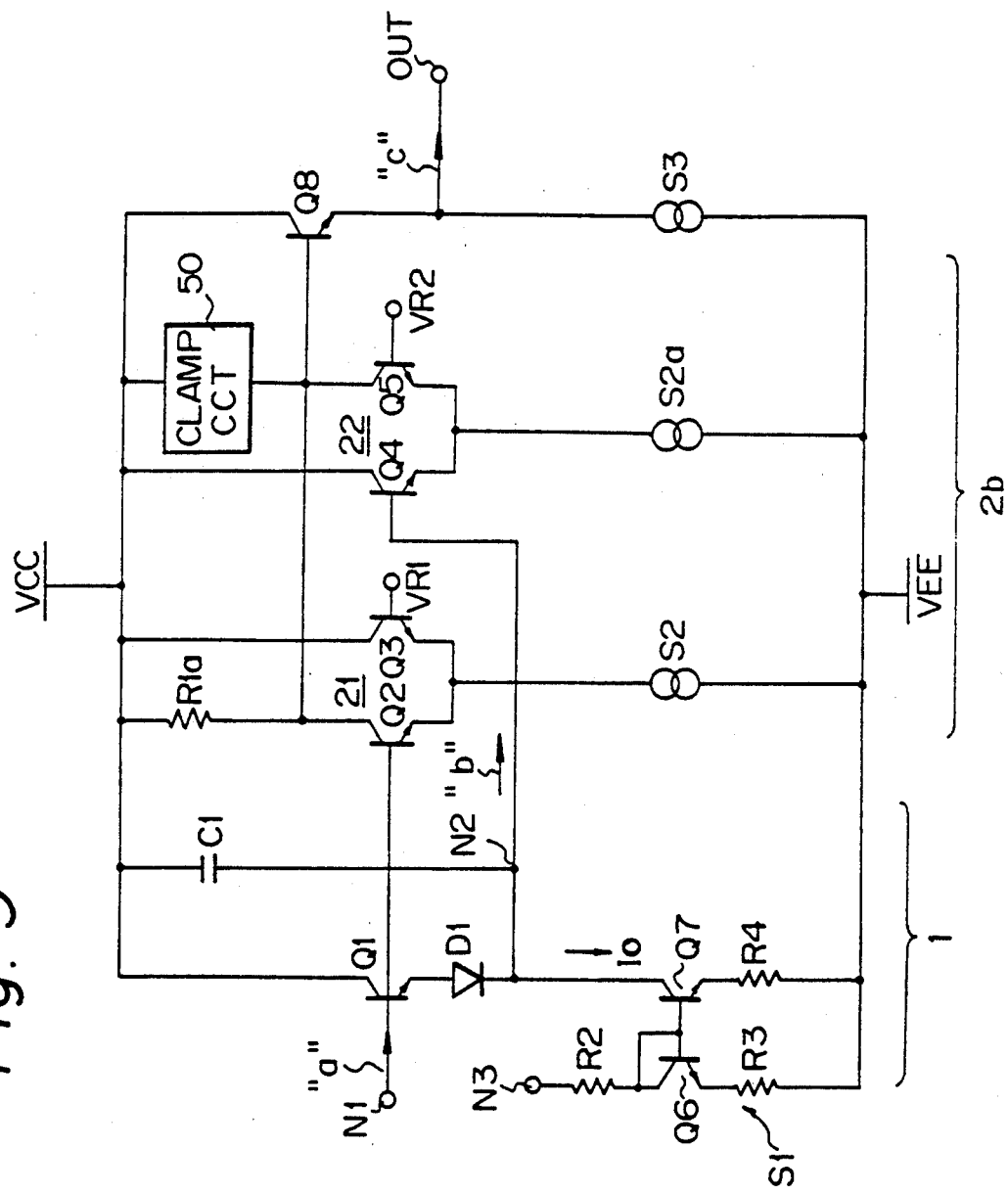
FIG. 9 is a block diagram showing a constitution of the monostable multivibrating circuit according to a third embodiment of the present invention.

FIG. 9 illustrates a constitution of the monostable multivibrating circuit according to a third embodiment of the present invention.

The illustrated circuit constitution and the operation thereof are the same as those in FIG. 4, except for several points below, and thus the explanation thereof is omitted.

In the third embodiment, the ECL circuit 2b is constituted such that the first pair of transistors 21 and the second pair of transistors 22 are connected in the form of a so-called "parallel" gate circuit in place of the form of the "series" gate circuit as in FIG. 4. Due to the "parallel" gate constitution, there is additionally provided a constant current source S2a which is connected between each emitter of the transistors Q4,Q5 and the power supply line VEE. Also, the resistance value of a load resistor R1a connected between the power supply line VCC and the collector of the transistor Q2 is selected to be approximately half of that of the load resistor R1 in FIG. 4. Note, reference 50 denotes a clamp circuit for stabilizing the output of the ECL circuit 2b (i.e., base potential of the output transistor Q8).

Although, in the third embodiment, the duration of the output one-shot pulse "c" is changed by a variable setting of the fall time in the fall time setting circuit 1, it may be changed by a variable setting of the reference voltages VR1,VR2, for example, using the reference voltage generating circuit 3 shown in FIG. 5.

Figure 10:
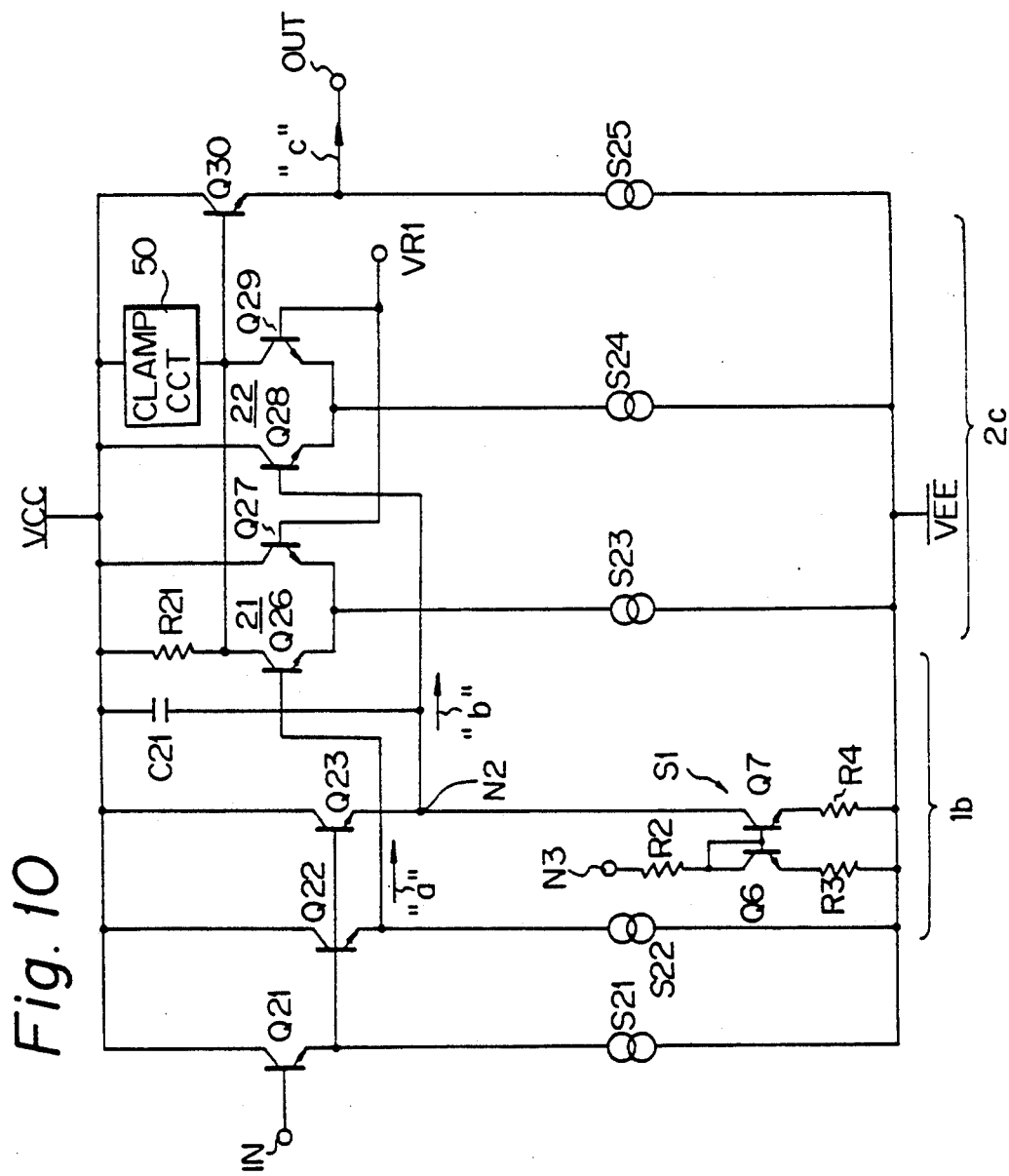
FIG. 10 is a block diagram showing a constitution of the monostable multivibrating circuit according to a fourth embodiment of the present invention.

FIG. 10 illustrates a constitution of the monostable multivibrating circuit according to a fourth embodiment of the present invention.

The illustrated circuit constitution and the operation thereof are the same as those in FIG. 9, except for several points below, and thus the explanation thereof is omitted.

In the fourth embodiment, the circuit threshold voltage of the first pair of transistors 21 (transistors Q26,Q27) and the circuit threshold voltage of the second pair of transistors 22 (transistors Q28,Q29) are set to be an identical reference voltage VR1. Also, the ECL circuit 2c is constituted such that the first pair of transistors 21 and the second pair of transistors 22 are connected in the form of a "parallel" gate circuit as in FIG. 9.

Also, the input pulse signal "a" is kept constant by an transistor Q22 and a constant current source S22 connected in series between the power supply lines VCC and VEE, and the output signal "b" of the fall time setting circuit 1b is variably changed by a transistor Q23 and the constant current source S1 connected in series between the power supply lines VCC and VEE.

Additionally, there is provided an input stage circuit including an input transistor Q21 and a constant current source S21 connected in series between the power supply lines vCC and VEE. The input transistor Q21 is turned ON in response to an input signal IN and thus feeds the output signal to each base of the transistors Q22 and Q23.

According to the fourth embodiment, since only the reference voltage VR1 is used as the circuit threshold voltage of the ECL circuit 2c, the duration of the one-shot pulse "c" can be changed only by a variable setting of the fall time in the fall time setting circuit 1b.

Although the present invention has been disclosed and described by way of several embodiments, it is apparent to those skilled in the art that other embodiments and modifications of the present invention are possible without departing from the spirit or essential features thereof.

We claim:

1. A monostable multivibrating circuit comprising:
   a fall time setting circuit responsive to an input pulse signal, for outputting one signal rising in response to the input pulse signal and falling with a gentle slope, said fall time setting circuit including means for variably setting only a fall time of said one output signal; and
   an emitter-coupled logic circuit outputting a one-shot pulse and including a first pair of transistors each having an emitter commonly connected to each other, a first base receiving the input pulse signal and a second base receiving a first reference signal, and a second pair of transistors each having an emitter commonly connected to each other, a first base receiving said output signal from said fall time setting circuit and a second base receiving a second reference signal, the one-shot pulse defined by a pulse starting time corresponding to a change in level of the first base input of said first pair of transistors and a pulse stopping time corresponding to a change in level of the first base input of said second pair of transistors, and the one-shot pulse has a HIGH level only when the first base input of said first pair of transistors is at a LOW level and the first base input of said second pair of transistors is at the HIGH level.

2. A monostable multivibrating circuit as set forth in claim 1, wherein the first reference signal is a first constant voltage signal and the second reference signal is a second constant voltage signal.

3. A monostable multivibrating circuit as set forth in claim 1, wherein said first pair of transistors and said second pair of transistors being connected as a series gate circuit.

4. A monostable multivibrating circuit as set forth in claim 3, wherein said emitter-coupled logic circuit further comprises a resistance element connected between a first power supply line and a collector of one of said transistors in said first pair of transistors and one of said transistors in said second pair of transistors, and a constant current source connected between the common emitters of said second pair of transistors and a second power supply line.

5. A monostable multivibrating circuit as set forth in claim 4, wherein said fall time setting circuit comprises:
a capacitor connected between the first power supply line and a node coupled to the first base input of said second pair of transistors; and
a constant current source connected between the node and the second power supply line and having a current setting terminal to which a control signal for variably setting the supply current is applied, the fall time being variably set according to the control signal.

6. A monostable multivibrating circuit as set forth in claim 5, wherein the constant current source comprises a current mirror circuit.

7. A monostable multivibrating circuit as set forth in claim 5, wherein said fall time setting circuit comprises an input stage circuit connected between the first power supply line and the node coupled to the first base input of said second pair of transistors, said input stage circuit including:
an input transistor having a collector connected to the first power supply line and responsive to the input pulse signal; and
a diode connected in the forward direction between an emitter of the input transistor and the node.

8. A monostable multivibrating circuit as set forth in claim 4, wherein at least one of the first and second reference signals is variably selected.

9. A monostable multivibrating circuit as set forth in claim 8, further comprising a reference signal generating circuit for generating the first and second reference signals.

10. A monostable multivibrating circuit as set forth in claim 9, wherein said reference signal generating circuit comprises:
a first resistor, a first end of which is connected to the first power supply line;
a first constant current source connected between a second end of said first resistor and the second power supply line and having a first control terminal;
a second constant current source connected to the first power supply line and responsive to a constant voltage at said second end of said first resistor; and
a second resistor connected between said second constant current source and a second control terminal, the first reference signal being output from said second end of said first resistor and being variably set according to a voltage signal applied to the first control terminal, the second reference signal being output from the connection point between said second constant current source and said second resistor and being variably set according to a voltage signal applied to the second control terminal.

11. A monostable multivibrating circuit as set forth in claim 1, wherein said first pair of transistors and said second pair of transistors are connected as a parallel gate circuit.

12. A monostable multivibrating circuit as set forth in claim 11, wherein said emitter-coupled logic circuit further comprises:
a resistance element connected between a first power supply line and a collector of one of said transistors in said first pair of transistors and one of said transistors in said second pair of transistors;
a first constant current source connected between the common emitters of said first pair of transistors and a second power supply line; and
a second constant current source connected between the common emitters of said second pair of transistors and the second power supply line.

13. A monostable multivibrating circuit as set forth in claim 11, wherein said fall time setting circuit further comprises:
a first transistor having a collector connected to a first power supply line and responsive to a change in the input signal;
a constant current source connected between an emitter of the first transistor and a second power supply line; and
a second transistor having a collector connected to the first power supply line and responsive to the change in the input pulse signal, wherein an emitter output of said first transistor is fed to the first base of said first pair of transistors and an emitter output of said second transistor is fed to the first base of said second pair of transistors.

14. A monostable multivibrating circuit as set forth in claim 12, wherein at least one of the first and second reference signals is variably selected.

15. A monostable multivibrating circuit as set forth in claim 14, further comprising a reference signal generating circuit for generating the first and second reference signals.

16. A monostable multivibrating circuit as set forth in claim 15, wherein said reference signal generating circuit comprises:
a first resistor, a first end being connected to the first power supply line;
a first constant current source connected between a second end of said first resistor and the second power supply line and having a first control terminal;
a second constant current source connected to the first power supply line and responsive to a constant voltage at said second end of said first resistor; and a second resistor connected between said second constant current source and a second control terminal, the first reference signal being output from said second end of said first resistor and being variably set according to a voltage signal applied to the first control terminal, the second reference signal being output from the connection point between said second constant current source and said second resistor and being variably set according to a voltage signal applied to the second control terminal 17. A monostable multivibrating circuit as set forth in claim 12, wherein the first and second reference signals are selected to be an identical voltage value.

18. A monostable multivibrating circuit comprising:
a fall time setting circuit responsive to an input pulse signal, for outputting first and second output signals each rising in response to the input pulse signal and each falling with a gentle slope, said fall time setting circuit including means for variably setting only a fall time of at least one of said first and second output signals; and
an emitter coupled logic circuit outputting a one-shot pulse and including a first pair of transistors each having an emitter commonly connected to each other, having a first base for receiving the first output signal and having a second base for receiving a first reference signal, and a second pair of transistors each having an emitter commonly connected to each other, having a first base for receiving the second output signal and having a second base for receiving a second reference signal;
the one-shot pulse being defined by a pulse starting time corresponding to a change in level of the first base input of said first pair of transistors and a pulse stopping time corresponding to a change in level of the first base input of said second pair of transistors, the one-shot pulse presenting a HIGH level only when the first base input from said first pair of transistors is at a LOW level and the first base input of said second pair of transistors is at the HIGH level.

19. A monostable multivibrating circuit as set forth in claim 18, wherein the first reference signal is a first constant voltage signal and the second reference signal is a second constant voltage signal.

20. A monostable multivibrating circuit as set forth in claim 18, wherein said first pair of transistors and said second pair of transistors being connected as a series gate circuit.

21. A monostable multivibrating circuit as set forth in claim 20, wherein said emitter-coupled logic circuit further comprises:
a resistance element connected between a first power supply line and a collector of one of said transistors in said first pair of transistors and one of said transistors in said second pair of transistors; and
a constant current source connected between the common emitters of said second pair of transistors and a second power supply line.

22. A monostable multivibrating circuit as set forth in claim 21, wherein said fall time circuit comprises:
an input transistor having a collector connected to the first power supply line and responsive to the input pulse signal and having an emitter;
a constant current source connected between the emitter of said input transistor and the second power supply line;
a capacitor connected between the first power supply line and the emitter of said input transistor; and
a level shift circuit for providing a signal propagation delay together with a level shift to a signal at the emitter of said input transistor, the signal at the emitter of said input transistor forming said first output signal, and the delayed and level-shifted signal forming said second output signal.

23. A monostable multivibrating circuit as set forth in claim 22, further comprising a second constant current source connected between said level shift circuit and the second power supply line, wherein said level shift circuit comprises:
a transistor having a collector connected to the first power supply line and responsive to the signal at the emitter of said input transistor; and
a diode connected in the forward direction between an emitter of said transistor and said second constant current source.

24. A monostable multivibrating circuit as set forth in claim 22, wherein at least one of the first and second reference signals is variably selected.

25. A monostable multivibrating circuit as set forth in claim 24, further comprising a reference signal generating circuit for generating the first and second reference signals which are variably changed.

26. A monostable multivibrating circuit as set forth in claim 25, wherein said reference signal generating circuit comprises:
a first resistor, a first end of which is connected to the first power supply line and having a second end;
a first constant current source connected between said second end of said first resistor and the second power supply line and having a first control terminal;
a second constant current source connected to the first power supply line and responsive to a constant voltage at said second end of said first resistor; and
a second resistor connected between said second constant current source and a second control terminal, the first reference signal being output from said second end of said first resistor and being variably set according to a voltage signal applied to the first control terminal, the second reference signal being output from a connection point between said second constant current source and said second resistor and being variably set according to a voltage signal applied to the second control terminal.

* * * * *

UNITED STATES PATENT AND TRADEMARK OFFICE
CERTIFICATE OF CORRECTION

PATENT NO. : 5,313,110                              Page 1 of 2
DATED      : May 17, 1994
INVENTOR(S): YOSHIO WATANABE ET AL.

It is certified that error appears in the above-indentified patent and that said Letters Patent is hereby corrected as shown below:

Col. 1, line 49, after "circuits" insert --.--.

Col. 3, line 20, change "m" to --m--;
        line 41, change "One-shot" to --one-shot--;
        line 46, after "therebetween" insert --.--;
        line 68, after "circuits" insert --.--.

Col. 5, line 19, change "Ri" to --R1--;
        line 21, change ":" to --;--.
        line 28, change "vCC" to --VCC--;
        line 67, after "N14" insert --.--.

Col. 6, line 18, after "simultaneously" insert --with--;
        line 37, change "one-hot" to --one-shot--.

Col. 8, line 37, change "vCC" to --VCC--.

UNITED STATES PATENT AND TRADEMARK OFFICE
CERTIFICATE OF CORRECTION

PATENT NO.  : 5,313,110
DATED       : May 17, 1994
INVENTOR(S) : Yoshio Watanabe et al.

It is certified that error appears in the above-indentified patent and that said Letters Patent is hereby corrected as shown below:

Column 12, line 5, after "time" insert --setting--.

Signed and Sealed this

Twenty-seventh Day of September, 1994

Attest:

BRUCE LEHMAN

Attesting Officer

Commissioner of Patents and Trademarks